Oct. 22, 1957 C. W. HARGENS 2,810,826

SATURABLE REACTOR TUNING OF SUPERHETERODYNE RECEIVER WITH DIFFERENTIAL CONTROL OF SATURATION FOR TRACKING

Filed Sept. 23, 1954

*INVENTOR.*

CHARLES W. HARGENS

*BY*

*Buckhorn, Smith & Harding*

ATTORNEYS 2,810,826
Patented Oct. 22, 1957

2,810,826

SATURABLE REACTOR TUNING OF SUPERHETERODYNE RECEIVER WITH DIFFERENTIAL CONTROL OF SATURATION FOR TRACKING

Charles W. Hargens, Enfield, Pa., assignor to Radio Condenser Company, Camden, N. J., a corporation of New Jersey Application September 23, 1954, Serial No. 457,807

6 Claims. (Cl. 250—20)

This invention relates to tuning means particularly adapted for radio receivers and relates specifically to tuning means particularly adapted for signal seek tuners of non-mechanical type.

Signal seeking tuners of the type which provide variation of tuning upon initiation by signal seeking buttons, or the like, generally involve mechanical variations of tuning elements under the action of driving motors or of springs which are placed under tension electromechanically. Such tuners involve mechanical complexity and, usually, the necessity for taking special precautions against overrun of the mechanical devices involved. Proposals have, accordingly, been made for non-mechanical tuners in which the signal seeking action is provided in the form of an electrically controlled sweep of reactance tuning elements. Such elements may take the form of reactance tubes which have their characteristics varied by means of variable applied biases or the like, or alternatively, there may be used saturable reactors which have inductive reactance values dependent upon variations of direct currents in their control windings.

In the use of saturable reactors for tuning it is generally required that a plurality of such reactors should tune simultaneously. Specifically, in a superheterodyne receiver there are one or more circuits to be tuned to the signal frequency and another circuit, controlling an oscillator frequency, to be tuned to a frequency having a fixed frequency difference with respect to the signal frequency, the difference representing the intermediate frequency of the receiver.

The broad object of the present invention is to provide accurate tracking of the tuning elements so as to maintain the production of a predetermined intermediate frequency over a wide tuning range. This end is attained by maintaining a predetermined difference in the direct control currents through the control windings of the signal and oscillator tuning reactors.

The foregoing broad object of the invention and other specific objects relating particularly to details of construction and operation will become apparent from the following description read in conjunction with the accompanying drawings, in which.

Figures 1, 2, 3:
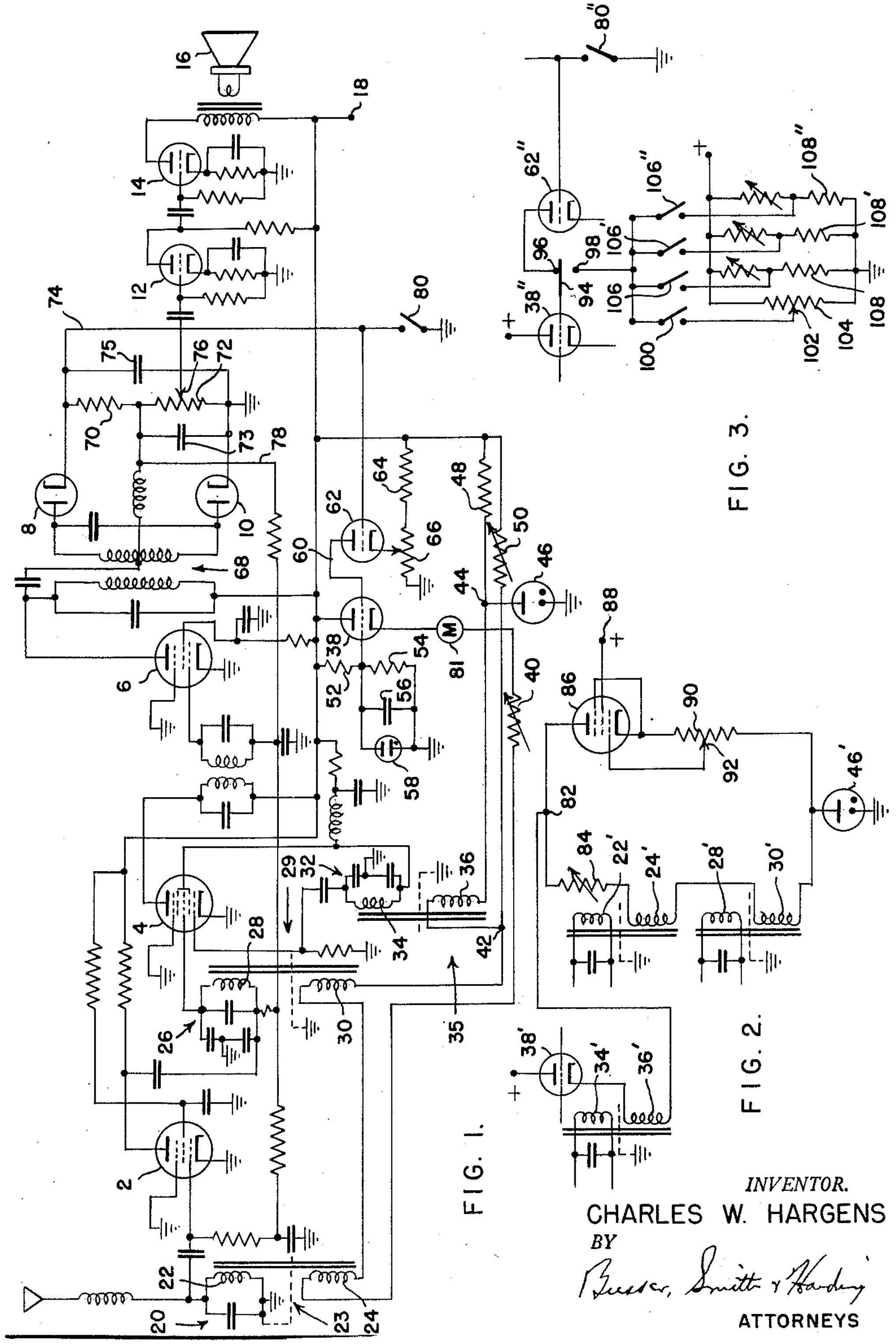
Figure 1 is a wiring diagram showing a preferred embodiment of the invention in a complete radio receiver.
Figure 2 is a wiring diagram showing an alternative type of circuit which may be substituted for certain parts of Figure 1.
Figure 3 is a wiring diagram illustrating modifications which may be made in the circuit of Figure 1 to provide manual and push button tuning as well as signal seek tuning.

Referring first to Figure 1, there is illustrated therein a complete radio receiver such as is used in automobiles, in which type of use signal seek tuning is particularly desirable. The signal seek controlling means illustrated and hereafter described is not part of the present invention but is described and claimed in the application of Donald L. Birx, Serial Number 457,987, filed September 23, 1954. The receiver illustrated is a modified superheterodyne receiver which comprises the radio frequency amplifier tube 2, the oscillator-converter tube 4, the intermediate frequency amplifier tube 6, a pair of diodes 8 and 10 arranged in a discriminator and detector circuit, an audio frequency amplifier tube 12, and an output tube 14 arranged to drive the loud speaker 16. Except for the discriminator-detector portion of the circuit, the received signal channels are generally conventional and detained description of the conventional parts of the receiver will not be required for an understanding of the present invention. In fact, as will be evident to those skilled in the art, the invention is applicable to many types of receivers including receivers for frequency modulated signals. The direct current supply is between ground and the B+ terminal 18 which is conventionally connected to the various tube stages already mentioned. The power supply may be of the conventional type used for automobile receivers and serving to provide a high voltage from the usual automobile battery-generator circuit. The various tubes used may be of heater types, the heaters being directly connected to the battery-generator circuit.

Antenna tuning is provided by the LC circuit indicated at 20, the inductance being provided by the signal winding 22 of a saturable reactor 23 having a core and a control winding 24 of conventional type. As is well known, the inductance of the signal winding of such a reactor varies with the direct flux produced in the core by direct current through the winding 24. Available at the present time are such reactors which, when their signal coils are connected to capacitors to form tuned circuits, provide resonant frequencies which are substantially linear with respect to the controlling direct currents. By reason of the substantially linear characteristics of the circuits which they tune, it is possible to provide such reactors in combinations which will provide proper tracking as required, for example, in superheterodyne radio receivers.

The input to the converter stage including the tube 4 is similarly tuned, there being provided the tuned circuit 26 including in parallel with its capacitance the signal coil 28 of a saturable reactor 29, the control coil of which is indicated at 30. The oscillator portion of the converter circuit is tuned by the tank circuit 32 which includes as its variable element the inductance provided by the signal winding 34 of the saturable reactor 35, the control coil of which is indicated at 36.

The control of direct currents through the control coils of the saturable reactors is effected through a triode 38, the anode of which is connected to the B+ terminal 18, while its cathode is connected through the series arrangement of variable resistance 40 and control coils 24 and 30 to a terminal 42. Terminal 42 is connected through control coil 36 to a terminal 44 which is connected to the anode of a voltage regulator tube 46, the cathode of which tube is grounded. Terminal 44 is additionally connected through a fixed resistor 48 to the B+ terminal 18. Terminal 42 is connected through variable resistor 50 to terminal 18. The particular connections of the control coils just described are advantageous to the securing of accurate tracking as will be described hereafter.

The grid of the triode 38 is connected to the junction of a pair of high resistances 52 and 54 connected in series between terminal 18 and ground. Shunted across the resistance 54 is a capacitor 56 and also a neon or other gas-filled tube indicated at 58. This may be, in its simplest form, of the cold electrode type illustrated, but may alternatively be of a heated cathode type involving, if desired, a control grid whereby adjustments of its firing charactertistics may be secured. In the absence of additional controls, such as will be referred to later, the circuit which has just been described provides a sawtooth wave generator of generally conventional type. Starting from a condition of substantial discharge of capacitor 56, current flowing through high resistance 52 will charge the capacitor until its ungrounded terminal reaches the breakdown potential of the tube 58. The tube thereupon fires, discharging the condenser to the deionization potential, whereupon the cycle is repeated, there being produced a sawtooth wave the rise of which is approximately linear though, for present purposes, such linearity is not important.

As a result of the action just described, a sawtooth wave of current corresponding to the potential existing at the ungrounded terminal of capacitor 56 will flow through the cathode of triode 38 and through the control windings of the variable reactors in a fashion which will be described in greater detail hereafter.

The grid of triode 38 is also connected at 60 to the anode of a triode 62, the cathode of which is connected to the variable contact of a potentiometer 66 which is connected between the terminal 18 and ground in series with a fixed resistor 64. The adjustment of the contact of potentiometer 66 serves to provide proper control of the current through triode 62 by the discriminator circuit which will now be described, it being noted that the resistor 52 constitutes the anode load resistor of the triode 62.

The discriminator circuit comprising the diodes 8 and 10 is of the conventional type used for discrimination in frequency modulation receiving circuits. It includes the transformer 68 having its primary and secondary coils tuned by fixed capacitors, together with various interconnections as illustrated to provide across the resistances at 70 and 72 potentials which vary in dependence upon the relationship of the input frequency to the frequency for which the discriminator is tuned. In the present case, this last frequency is the intermediate frequency of the receiver. It will be noted that the resistances 70 and 72 are in series between ground and a connection 74 to the grid of the triode 62. As a signal is tuned from a lower to a higher frequency, there will appear at connection 74 a varying direct potential which first increases in a negative direction with respect to ground, then decreases in amplitude through zero and increases in the positive direction to a positive peak, then again decreasing. Accurate tuning occurs when this signal is of approximately zero value. Desirably, adjustments are made so that accurate tuning occurs when the signal is slightly on the positive side of zero with respect to ground. The discriminator circuit which has been described serves also for automatic volume control by delivery of a biasing potential through connection 78 to the control grids of the tubes 2, 4 and 6. It also serves to provide detection of the intermediate frequency signals giving an audio signal output through the provision, as the resistance 72, of a potentiometer having an adjustable contact 76 connected to the grid of the audio amplifier triode 12. Capacitor 73 serves as a bypass for signals of intermediate frequency but is sufficiently small so as not to attenuate the audio frequency signals. Capacitor 75 is chosen sufficiently large to provide a suitable time constant for the output on line 74 of a signal seek arresting signal. Adjustment of the contact 76 provides manual volume control. It may be pointed out that the manual volume control and automatic volume control connections do not interfere with the function of the discriminator circuit in providing signal seek control signals through connection 74.

A seek initiating button 80 is adapted to be closed momentarily to ground the connection 74.

Inasmuch as there are no mechanically operating parts, there is nothing available in the circuit for the usual mechanical indication of the frequency tuned. Such indication is provided, however, by a milliammeter 81 in the anode-cathode circuit of triode 38. Inasmuch as the frequency tuned is dependent upon the current through this tube, the milliammeter 81 may be calibrated in terms of signal frequency.

The operation of the described circuit may be best considered by starting with the condition of the grid of triode 62 at ground potential, such as would be the case if no signal from a transmitting station was being received. In such case, with the cathode potential of triode 62 adjusted at potentiometer 66 for proper operation, the grid of triode 62 being thereby biased negatively with respect to its cathode, sweeping would take place continuously due to the sawtooth wave produced by the sweep generator. In each sweep the current through the control coils 24, 30 and 36 would start from a minimum value, rising to a maximum value at the time of firing of the neon tube 58. Under these conditions, the tuning sweep takes place from lower to higher frequency, the inductances of the coils 22, 28 and 34 decreasing with increase of the control currents. The rate of repetition of the sweep cycle may be fairly high though, desirably, it is of the order of one cycle per several seconds in view of various considerations hereinafter brought out.

Assuming that the signal from a transmitting station is of sufficient intensity, as the sweep of the tuning through the frequency of the signal occurs, there will be first produced a negative signal with respect to ground through the connection 74, this signal passing through zero to a positive value. When a sufficiently positive value of the signal occurs, the tube 62 increases its conductance with a consequent drawing of current through resistor 52 to decrease the potential which appears at the anode of triode 62 and, hence, at the grid of triode 38. An equilibrium condition is attained at which the potential at the anode of triode 62 produces a current flow through the cathode of triode 38 to maintain a tuning condition giving rise to an output signal from the discriminator to provide a grid potential at triode 62 which will maintain its anode potential. Accordingly, the sweep action ceases, the potential being lower than the firing potential of tube 58. The initial adjustment of the discriminator and of the potentiometer 66 is made so that this corresponds to sharp tuning of the station. Furthermore, the system is in stable equilibrium so that any drift of the tuning is compensated for by a readjustment to maintain an equilibrium condition. Thus, sharp tuning is maintained.

It it is desired to seek the next station in the direction of higher frequency, a momentary depression of the seek button 80 will ground the grid of triode 62, reducing its anode-cathode current and raising the potential of its anode and providing a resumption of the seek action by initiating further charging of capacitor 56. So long as the seek button 80 is held closed, the seek action would continue, and it is for this reason that, desirably, the seeking cycle has a period in excess of one second, since, otherwise, the depression and release of the seek button could not be accomplished with sufficient rapidity to cause the seeking action to be automatically interrupted by a new received signal which was not greatly different in frequency from the signal originally received.

Furthermore, since the operator of the receiver may desire to try to tune a particular station, and for this purpose may be watching the indications on the meter 81, it is desirable that the seek action should not be substantially more rapid than the movement of the meter needle which, due to its inertia, will generally have an appreciable lag of current indication with respect to actual current therethrough.

Reference may now be made to the matter of tracking, which, as stated heretofore, is the subject matter of the present application, the signal seek control operation being the subject matter of said Birx application.

As noted above, the frequency of a resonant circuit tuned by the signal winding of a variable reactor of the type referred to is substantially linearly related to the current through its control winding. Accordingly, in the case of two similar reactors, it is possible to maintain a constant frequency difference if the control currents through the respective control windings have a constant difference. The circuit arrangement which is shown in Figure 1 accomplishes this end to a sufficiently good approximation for practical use. It will be noted that the control coils 24 and 30 are in series and, consequently, carry the same current so that they will track at the same frequencies of their resonant circuits. It will be noted that the current through the coils 24 and 30 also flows through the control coil 36 of the oscillator. Additionally, the coil 36 receives current from the terminal 18 through the adjustable resistor 50. If this adjustable resistor 50 is of much greater resistance value than the resistance of the coil 36, the current therethrough is substantially constant due to the fact that the potential at 18 with respect to ground remains substantially constant and the potential of the anode of the voltage regulator tube 46 is substantially constant with respect to ground. By adjustment of the resistance 50, therefore, there is caused to pass through the coil 36 a current which exceeds that passing through the coils 24 and 30 by a definite amount, and adjustment is made such that this amount of current, considering the linear characteristics referred to above, corresponds to a constant frequency difference of tuning (i. e. the intermediate frequency of the receiver) in the circuit 32 as compared with the circuits 20 and 26. Accurate tracking is thus provided.

Still greater accuracy of the maintained frequency difference may be achieved by substitution of a pentode for a resistance to control the current difference involved in the respective control coils. In Figure 2, showing such an arrangement, the various parts corresponding to those in Figure 1 are designated by similar numerals but with added primes. The sequence of arrangement in the circuit is somewhat different, to illustrate possible variation, but it will be evident that here the current through the coil 36′ exceeds that through the coils 24′ and 30′ by the current which flows through the pentode 86 from the terminal 82 to the voltage regulator tube 46′. The pentode 86 is connected as illustrated, with its anode joined to the terminal 82, with its screen grid connected to a terminal 88 of suitable potential derived from the potential at terminal 18, and with its cathode in series with a potentiometer 90, the adjustable contact 92 of which is connected to the control grid. A variable resistor 84 corresponds to the variable resistor 40 for initial adjustment of current values. Due to the known constant anode current characteristic of a pentode with respect to variations of its anode-cathode potential, the pentode 86 maintains a substantially constant current flow therethrough to represent the difference current between the flows through the coil 36′ on the one hand and coils 24′ and 30′ on the other. The value of this difference current may be adjusted by the contact 92. The refinement introduced by the pentode 86 is generally unnecessary except in the case of a receiver of very high sensitivity and critical adjustments.

It it is desired to provide for manual continuous tuning adjustment and/or push button tuning in addition to signal seek tuning, this may be readily accomplished in various fashions as illustrated, for example, in Figure 3. In this figure, triodes 38″ and 62″ correspond to the triodes 38 and 62, respectively, of Figure 1, and the signal seek initiating button 80″ corresponds to 80 in Figure 1. The remaining portions of the receiver circuit may be as already described. To provide for the alternative tuning, there is interposed between the grid of triode 38″ and the anode of triode 62″ a single-pole double-throw switch 94 which may make alternative contacts at 96 and 98. When engaging the former contact, the circuit is precisely the same as in Figure 1 and signal seek operation may take place as described.

When contact at 98 is effected, the arrangement is then such as to provide, in accordance with Figure 3, either continuous manual knob adjustment or push-button control. The former involves the connection to the contact 98 through a switch 100 of the movable contact 102 of a potentiometer 104 connected between the high voltage positive supply terminal and ground. With switch 100 closed, it will be evident that adjustment of the contact 102 will control the current flow through the triode 38″ and, consequently, the currents through the control coils 24, 30 and 36. Tracking will take place as already described. Inasmuch as the potential at contact 102 will be definitely determined by its position and a relatively heavy current through potentiometer 104, there is no need to disconnect the sweep generator from the grid of triode 38″.

For push button control, there are provided the individually operable switches 106, 106′ and 106″ which are connected, respectively, between the contact 98 and individual contacts of resistance arrays 108, 108′ and 108″ connected between the positive supply terminal and ground.

These individual resistance arrays may be made adjustable to determine the potentials applied to the grid of triode 38″ or, alternatively, may take the form of individually adjustable contacts on a single resistance array. In any event, by preliminary adjustment, each of the switches 106, 106′ and 106″, which may take the form of interlocking buttons, will correspond to a particular frequency. It will be evident that in line with the foregoing continuous manual adjustment and push button adjustment may be provided in association with the signal seeking tuning means.

While the tracking provisions constituting the subjects of the present invention have been described in a signal seek tuner, and specifically in a tuner of said Birx application, it will be evident that the invention may be used in any tuner involving saturable reactors, as, for example, in a tuner involving manual knob and/or push button control as exemplified in Figure 3 even if the signal seek connections thereof were omitted. It is to be understood, accordingly, that the invention is not to be considered except as required by the following claims.

What is claimed is:

1. In a receiver, a pair of variable tuning circuits, each of said tuning circuits comprising, as a variable reactance determinative of its resonant frequency, a saturable reactor having a control winding, and means for supplying from a common source variable currents to the respective control windings having a substantially constant difference in magnitude.

2. In a receiver, a pair of variable tuning circuits, each of said tuning circuits comprising, as a variable reactance determinative of its resonant frequency, a saturable reactor having a control winding, means connecting said control windings in series with a variable source of current, and means providing a substantially constant current component to one only of said control windings.

3. In a receiver, a pair of variable tuning circuits, each of said tuning circuits comprising, a variable reactance determinative of its resonant frequency, a saturable reactor having a control winding, means connecting said control windings in series with a variable source of current, and means providing a substantially constant current component to one only of said control windings, the last mentioned means comprising a constant-current pentode circuit.

4. In a superheterodyne receiver, a variable signal tuning circuit, an oscillator having a variable tuning circuit determinative of the frequency of its oscillations, each of said tuning circuits comprising, as a variable reactance determinative of its resonant frequency, a saturable reactor having a control winding, and means for supplying from a common source variable currents to the respective control windings having a substantially constant difference in magnitude.

5. In a superheterodyne receiver, a variable signal tuning circuit, an oscillator having a variable tuning circuit determinative of the frequency of its oscillations, each of said tuning circuits comprising, as a variable reactance determinative of its resonant frequency, a saturable reactor having a control winding, means connecting said control windings in series with a variable source of current, and means providing a substantially constant current component to one only of said control windings.

6. In a superheterodyne receiver, a variable signal tuning circuit, an oscillator having a variable tuning circuit determinative of the frequency of its oscillations, each of said tuning circuits comprising, as a variable reactance determinative of its resonant frequency, a saturable reactor having a control winding, means connecting said control windings in series with a variable source of current, and means providing a substantially constant current component to one only of said control windings, the last mentioned means comprising a constant-current pentode circuit.

References Cited in the file of this patent

UNITED STATES PATENTS

| | | |
|---|---|---|
| 2,581,202 | Post | Jan. 1, 1952 |
| 2,601,384 | Goodrich, Jr. | June 24, 1952 |